(12) United States Patent
Cho et al.

(10) Patent No.: US 9,853,031 B1
(45) Date of Patent: Dec. 26, 2017

(54) SEMICONDUCTOR DEVICE

(71) Applicant: SAMSUNG ELECTRONICS CO., LTD., Suwon-si, Gyeonggi-do (KR)

(72) Inventors: Min Hee Cho, Suwon-si (KR); Woo Song Ahn, Hwaseong-si (KR); Min Su Choi, Incheon (KR); Satoru Yamada, Yongin-si (KR); Jun Soo Kim, Seongnam-si (KR); Sung Sam Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/433,193

(22) Filed: Feb. 15, 2017

(30) Foreign Application Priority Data

Aug. 12, 2016 (KR) .................. 10-2016-0103037

(51) Int. Cl.
| | | |
|---|---|---|
| *H01L 23/48* | (2006.01) | |
| *H01L 27/108* | (2006.01) | |
| *H01L 29/06* | (2006.01) | |
| *H01L 29/423* | (2006.01) | |
| *H01L 29/51* | (2006.01) | |
| *H01L 49/02* | (2006.01) | |

(52) U.S. Cl.
CPC .. *H01L 27/10823* (2013.01); *H01L 27/10814* (2013.01); *H01L 27/10876* (2013.01); *H01L 28/90* (2013.01); *H01L 29/0649* (2013.01); *H01L 29/4236* (2013.01); *H01L 29/51* (2013.01)

(58) Field of Classification Search
CPC ......... H01L 27/10823; H01L 27/10814; H01L 27/10876; H01L 28/90; H01L 29/0649; H01L 29/4236; H01L 29/51
See application file for complete search history.

(56) References Cited

U.S. PATENT DOCUMENTS

| | | | |
|---|---|---|---|
| 7,547,604 | B2 | 6/2009 | Tran |
| 8,835,275 | B2 | 9/2014 | Park et al. |
| 8,975,140 | B2 | 3/2015 | Chung |
| 9,018,695 | B2 | 4/2015 | Yang |
| 9,029,957 | B2 | 5/2015 | Yoon |
| 9,240,414 | B1 | 1/2016 | Kim et al. |

(Continued)

FOREIGN PATENT DOCUMENTS

| | | |
|---|---|---|
| KR | 10-2013-0005775 A | 1/2013 |
| KR | 10-2013-0022950 A | 3/2013 |
| KR | 10-2014-0100647 A | 8/2014 |

*Primary Examiner* — Nicholas Tobergte
(74) *Attorney, Agent, or Firm* — Lee & Morse, P.C.

(57) ABSTRACT

A semiconductor device includes an active region on a substrate, a device isolation film on the substrate to define the active region, a gate trench including a first portion in the active region and a second portion in the device isolation film, a gate electrode including a first gate embedded in the first portion of the gate trench and a second gate embedded in the second portion of the gate trench, a first gate capping pattern on the first gate and filling the first portion of the gate trench, and a second gate capping pattern on the second gate and filling the second portion of the gate trench, an upper surface of the first gate being higher than an upper surface of the second gate, and the first gate capping pattern and the second gate capping pattern have different structures.

20 Claims, 25 Drawing Sheets

(56) References Cited

U.S. PATENT DOCUMENTS

2010/0238728 A1    9/2010  Leung
2013/0171801 A1*  7/2013  Park .................... H01L 21/0214
                                                    438/400
2015/0340453 A1*  11/2015  Cho ...................... H01L 29/423
                                                    257/330
2016/0126246 A1*  5/2016  Lee ................... H01L 27/10814
                                                    257/296

* cited by examiner

SEMICONDUCTOR DEVICE

CROSS-REFERENCE TO RELATED APPLICATION

Korean Patent Application No. 10-2016-0103037, filed on Aug. 12, 2016, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As the integration of semiconductor devices has rapidly increased, the size of transistors has been sharply decreased. Thus, research into three-dimensional transistors having a recess gate structure, an embedded gate structure, or the like, has been actively undertaken.

SUMMARY

According to an embodiment, a semiconductor device includes an active region on a substrate, a device isolation film defining the active region, a gate trench extended into the device isolation film while passing through the active region and including a first portion located in the active region and a second portion located in the device isolation film, a gate electrode including a first gate embedded in the first portion of the gate trench and a second gate embedded in the second portion of the gate trench, a first gate capping pattern disposed on the first gate and filling the first portion of the gate trench, and a second gate capping pattern disposed on the second gate and filling the second portion of the gate trench. An upper surface of the first gate is higher than an upper surface of the second gate, and the first gate capping pattern and the second gate capping pattern have different structures.

According to another embodiment, a semiconductor device includes a substrate including an active region and a device isolation film defining the active region, a gate trench extended into the device isolation film while passing through the active region, and including a first portion located in the active region and a second portion located in the device isolation film, a gate electrode including a first gate embedded in the first portion of the gate trench and a second gate embedded in the second portion of the gate trench, and a gate capping pattern disposed on the first gate and the second gate. An upper surface of the first gate is higher than an upper surface of the second gate, and the gate capping pattern has a structure in which different materials are stacked.

According to another embodiment, a semiconductor device includes an active region on a substrate, a device isolation film on the substrate to define the active region, a gate trench including a first portion through the active region and a second portion through the device isolation film, a gate electrode including a first gate in the first portion of the gate trench and a second gate in the second portion of the gate trench, an upper surface of the first gate being higher than an upper surface of the second gate relatively to a bottom of the substrate, a first gate capping pattern on the first gate, and a second gate capping pattern on the second gate, the second gate capping pattern having a lower dielectric constant than the first gate capping pattern.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, embodiments will be described with reference to the accompanying drawings.

Figure 1:
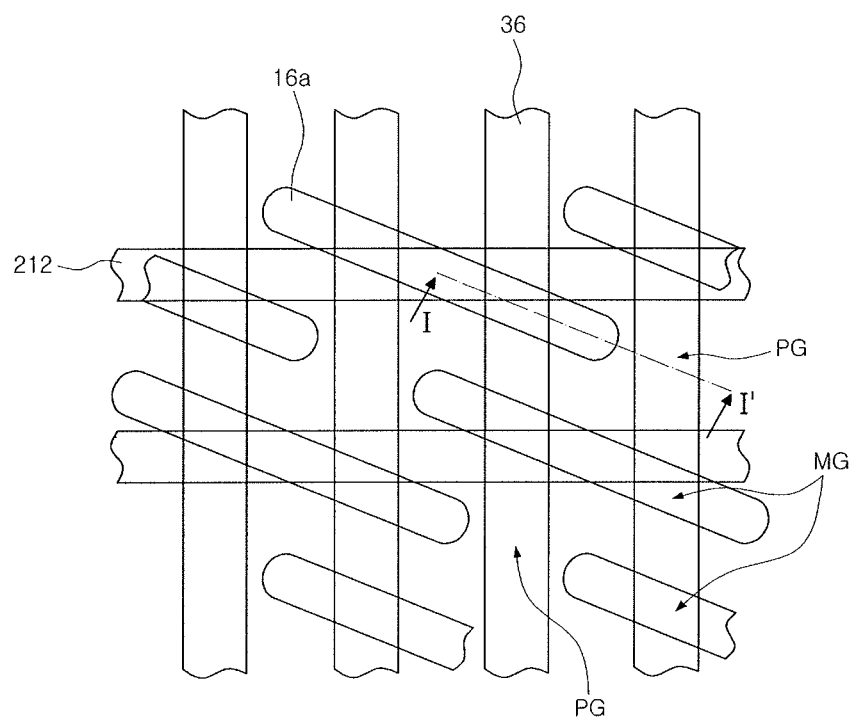
FIG. 1 illustrates a layout diagram of a semiconductor device according to an example embodiment.

FIG. 1 is a layout diagram of a semiconductor device according to an example embodiment. FIGS. 2 to 6 are cross-sectional views of semiconductor devices according to example embodiments.

Figure 2:
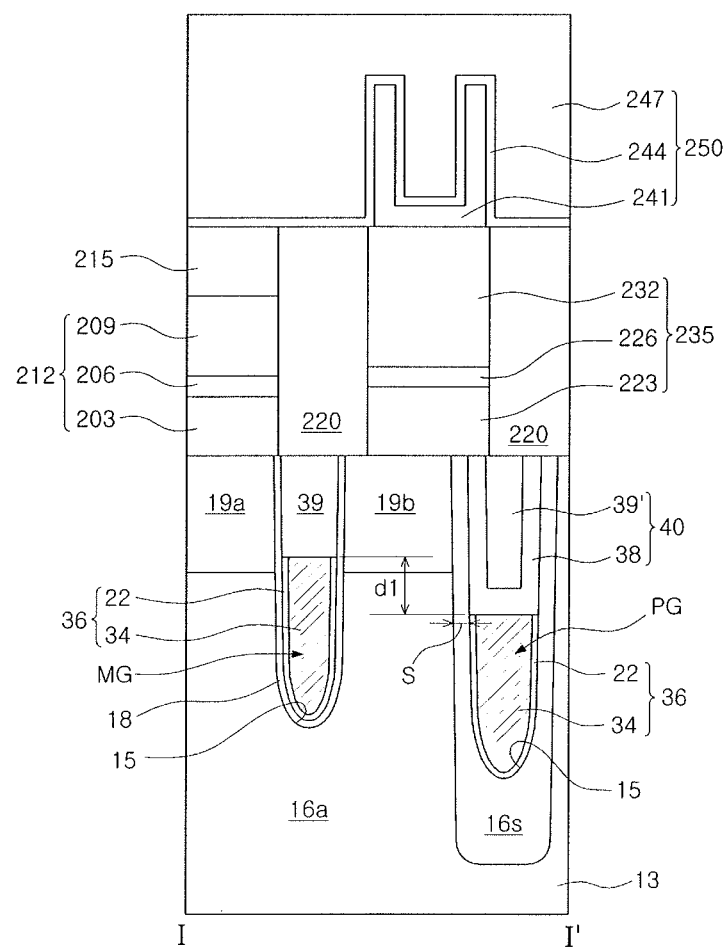
FIGS. 2 to 6 illustrate cross-sectional views of semiconductor devices according to example embodiments.

First, with reference to FIGS. 1 and 2, a semiconductor device according to an example embodiment will be described. FIG. 2 is a cross-sectional view along line I-I' of FIG. 1.

With reference to FIGS. 1 and 2, a semiconductor substrate 13 may be provided. The semiconductor substrate 13 may be, e.g., a silicon-containing semiconductor. For example, the semiconductor substrate 13 may be a single-crystal silicon substrate.

A device isolation film 16s defining an active region 16a may be disposed in the semiconductor substrate 13. The device isolation film 16s may be a shallow trench isolation portion. The active region 16a may have a first conductivity-type. In this case, the first conductivity type may be P-type or N-type. The device isolation film 16s may include an insulating material, e.g., silicon oxide, silicon nitride, silicon oxynitride, and combinations thereof.

A gate trench 15 may be formed in the semiconductor substrate 13. The gate trench 15 may be extended into the device isolation film 16s while passing through the active region 16a. The gate trench 15 may include a first portion located in the active region 16a and a second portion located in the device isolation film 16s, and a bottom of the first portion may be positioned to be higher than a bottom of the second portion relative to a bottom of the semiconductor substrate 13.

A first source/drain region 19a and a second source/drain region 19b may be disposed in the active region 16a on both sides of the gate trench 15. The first source/drain region 19a and the second source/drain region 19b may be spaced apart from each other by the gate trench 15. The first source/drain region 19a and the second source/drain region 19b may have a second conductivity-type different from the first conductivity-type. In this case, the second conductivity type may be N-type or P-type.

A gate electrode 36 may be disposed in the gate trench 15. The gate electrode 36 may have an embedded gate structure, and the gate electrode 36 may partially fill the gate trench 15. An upper surface of the gate electrode 36 may be lower than an upper surface of the active region 16a.

In the example embodiment, the first portion of the gate electrode 36 embedded in the active region 16a may be a main gate MG, and the second portion of the gate electrode 36 disposed adjacently to the active region 16a and embedded in the device isolation film 16s may be a field pass gate PG. The main gate MG embedded in the active region 16a may be disposed in such a manner that a level of an upper surface thereof is higher than that of an upper surface of the field pass gate PG embedded in the device isolation film 16s. For example, the upper surface of the field pass gate PG may be disposed to be lower than an upper surface of the main gate MG by a first distance d1. Due to such a difference in heights, the field pass gate PG may not overlap the second source/drain region 19b, e.g., a bottom of the second source/drain region 19b may be spaced apart from a top of the field pass gate PG along a vertical direction. As such, an electric field between the source/drain region 19b and the field pass gate PG may be reduced due to an increase in distance between the second source/drain region 19b and the field pass gate PG, and gate induced drain leakage (GIDL) by the field pass gate PG may be reduced.

The gate electrode 36 may include a barrier layer 22 and a conductive layer 34 provided on the barrier layer 22. The barrier layer 22 may cover a lateral surface and a bottom surface of the conductive layer 34. The barrier layer 22 may be formed to have a uniform thickness. The barrier layer 22 may be formed of, e.g., metal nitride. The metal nitride may include, e.g., TiN, WN, or the like. The metal nitride may be a metal nitride doped with a specific element. The specific element may be an element to be able to change a work function of the metal nitride. For example, when the active region 16a is a p-type conductivity active region and the first and second source/drain regions 19a and 19b are n-type conductivity regions, the specific element within the barrier layer 22 may be lanthanum (La). The conductive layer 34 may be formed of a metal having a specific resistance lower than that of the barrier layer 22, e.g., tungsten.

A first gate capping pattern 39 may be disposed on the main gate MG, and a second gate capping pattern 40 may be disposed on the field pass gate PG. The second gate capping pattern 40 may have a structure different from that of the first gate capping pattern 39. The first gate capping pattern 39 may be formed of, e.g., silicon nitride. The second gate capping pattern 40 may include a second lower gate capping layer 38 and a second upper gate capping layer 39'. The second lower gate capping layer 38 may include an insulating material having a dielectric constant lower than that of silicon nitride. For example, the second lower gate capping layer 38 may include silicon oxide or a low-k material having a dielectric constant lower than that of silicon oxide. The second upper gate capping layer 39' may be formed of the same material as that of the first gate capping pattern 39.

In the example embodiment, the second gate capping pattern 40 may have a relatively low dielectric constant as compared to the first gate capping pattern 39. Thus, parasitic capacitance by the field pass gate PG may also be reduced along with an electric field reduction effect.

A gate dielectric 18 may be disposed on an inner wall of the gate trench 15. The gate dielectric 18 may be formed on a surface of the active region 16a exposed to the gate trench 15. The gate dielectric 18 may be formed of, e.g., silicon oxide, or silicon oxide containing nitrogen. The gate dielectric 18 may be disposed between the first gate capping pattern 39 and the active region 16a while being interposed between the gate electrode 36 and the active region 16a. The gate dielectric 18 may be in contact with the barrier layer 22.

A bit line structure 212 and a bit line capping pattern 215 may be sequentially stacked on the first source/drain region 19a. The bit line structure 212 may include a bit line contact portion 203 physically and/or electrically connected to the first source/drain region 19a and a wiring portion on the bit line contact portion 203. The bit line structure 212 may include an intermediate portion 206 disposed between the bit line contact portion 203 and the wiring portion 209. In the bit line structure 212, the bit line contact portion 203 may be formed of, e.g., polysilicon, the wiring portion 209 may be formed of a metal, e.g., tungsten or the like, and the intermediate portion 206 may be formed of a material including, e.g., a metal silicide and/or a metal nitride. The bit line capping pattern 215 may be formed of an insulating material, e.g., silicon nitride or the like.

An interlayer insulating layer 220 may be disposed on lateral surfaces of the bit line structure 212 and the bit line capping pattern 215. The contact structure 235 may be physically and/or electrically connected to the second source/drain region 19b while penetrating through the interlayer insulating layer 220.

The contact structure 235 may include a lower contact pattern 223, a metal silicide layer 226 on the lower contact pattern 223, and an upper contact pattern on the metal silicide layer 226. The contact structure 235 may further include a conductive barrier layer covering a lateral surface and a bottom surface of the upper contact pattern 232. The lower contact pattern 223 may be formed of, e.g., polysilicon. The upper contact pattern 232 may be formed of a metal. The conductive barrier layer may include a metal nitride.

An information storage element 250 storing information therein may be disposed on the contact structure 235. For example, when a semiconductor device according to an example embodiment is a dynamic random access memory (DRAM) device, the information storage element 250 may be a capacitor. For example, the information storage element 250 may include a first electrode 241 connected to the contact structure 235, a capacitor dielectric 244 on the first electrode 241, and a second electrode 247 on the capacitor dielectric 244. However, example embodiments are not limited to a DRAM device, but may be applied to other memory devices, e.g., magnetic random access memory (MRAM) devices and the like.

According to another embodiment, with reference to FIGS. 1 and 3, a semiconductor device according to an example embodiment will be described. A structure different from that of the semiconductor device illustrated in FIG. 2 will be principally described below, and overlapping descriptions will be omitted.

Figure 3:
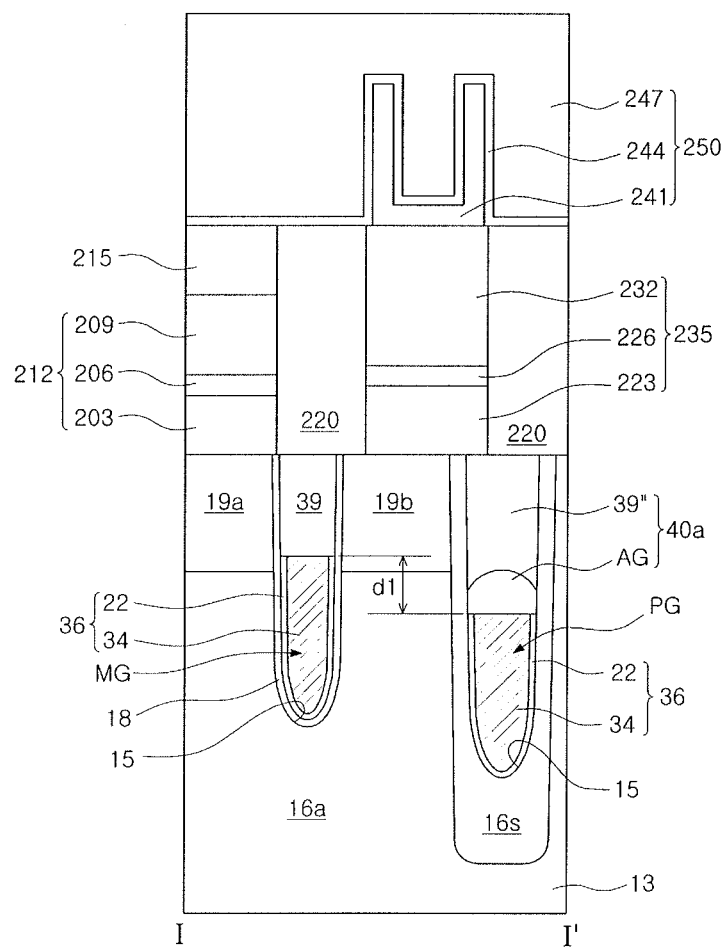

With reference to FIGS. 1 and 3, the upper surface of the field pass gate PG may be disposed to be lower than the upper surface of the main gate MG by the first distance d1.

An electric field between the source/drain region 19b and the field pass gate PG may be reduced due to such a difference in height, and further, gate induced drain leakage (GIDL) by the field pass gate PG may be reduced.

The first gate capping pattern 39 may be disposed on the main gate MG, and a second gate capping pattern 40a may be disposed on the field pass gate PG. The second gate capping pattern 40a may have a structure different from that of the first gate capping pattern 39. The second gate capping pattern 40a may include a second gate capping layer 39" and an air gap AG disposed below the second gate capping layer 39".

The second gate capping layer 39" may include an insulating material formed by a deposition process in which step coverage characteristics are poor. The air gap AG may be intentionally formed in a process of depositing the second gate capping layer 39". The location and form of the air gap AG are not limited to those illustrated in FIG. 3. The air gap AG may be formed within the second gate capping layer 39". The second gate capping layer 39" may be formed of, e.g., the same material as that of the first gate capping pattern 39.

In the example embodiment, the second gate capping pattern 40a may include the air gap AG, and thus, may have a relatively low dielectric constant as compared to that of the first gate capping pattern 39. Thus, parasitic capacitance by the field pass gate PG may also be reduced along with an electric field reduction effect.

According to another embodiment, with reference to FIGS. 1 and 4, a semiconductor device according to an example embodiment will be described. A structure different from that of the semiconductor device illustrated in FIG. 2 will be principally described below, and overlapping descriptions will be omitted.

Figure 4:
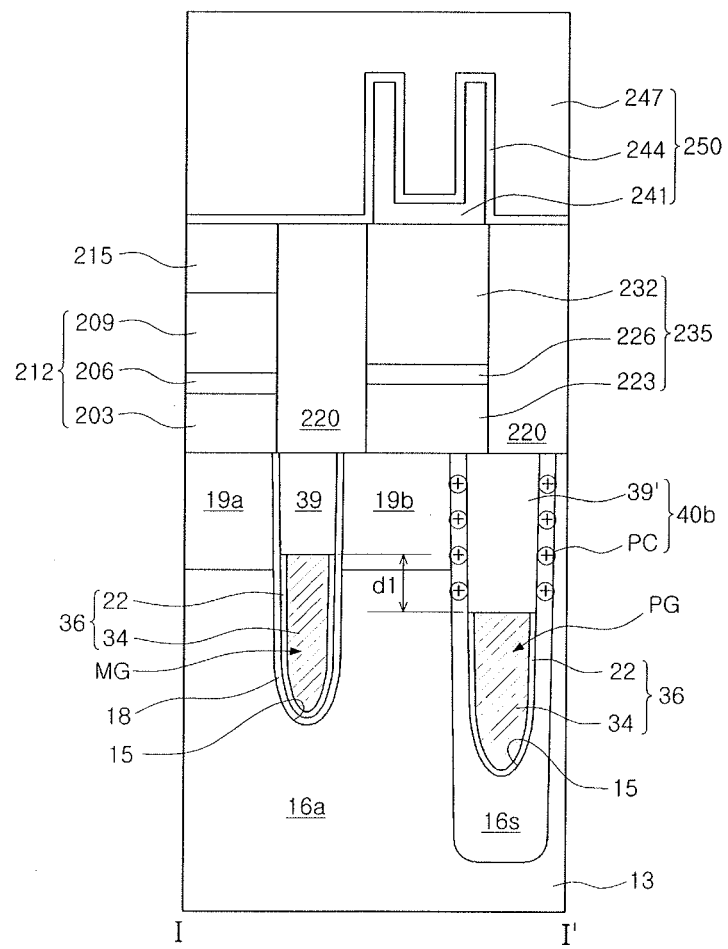

With reference to FIGS. 1 and 4, the upper surface of the field pass gate PG may be disposed to be lower than the upper surface of the main gate MG by the first distance d1. An electric field between the source/drain region 19b and the field pass gate PG may be reduced, and further, gate induced drain leakage (GIDL) by the field pass gate PG may be reduced.

The first gate capping pattern 39 may be disposed on the main gate MG, and a second gate capping pattern 40b may be disposed on the field pass gate PG. The second gate capping pattern 40b may have a structure different from that of the first gate capping pattern 39. The second gate capping pattern 40b may include the second gate capping layer 39' and positive fixed charges PC trapped on a surface of the device isolation film 16s in contact with the second gate capping layer 39'. The positive fixed charges PC may be formed by a plasma process or a heat treatment process. The positive fixed charges PC may be nitrogen cations formed using, e.g., a plasma nitriding process or a heat treatment process using a nitrogen oxide (NO) gas. For example, when the active region 16a is a p-type doped region and the second source/drain region 19b is an n-type doped region, the positive fixed charges PC may further reduce an electric field between the second source/drain region 19b and the field pass gate PG.

In the example embodiment, an upper surface height of the field pass gate PG may be reduced, and GIDL by the field pass gate PG may be reduced using the positive fixed charges PC.

According to another embodiment, with reference to FIGS. 1 and 5, a semiconductor device according to an example embodiment will be described below. A structure different from that of the semiconductor device illustrated in FIG. 2 will be principally described below, and overlapping descriptions will be omitted.

Figure 5:
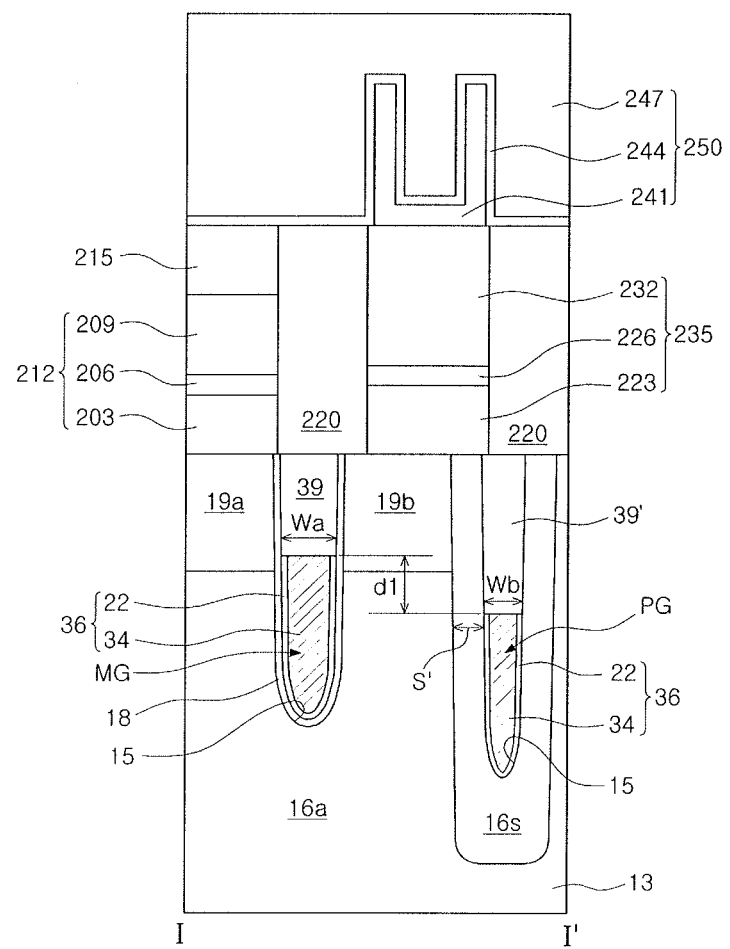

With reference to FIGS. 1 and 5, the upper surface of the field pass gate PG may be disposed to be lower than the upper surface of the main gate MG by the first distance d1. The field pass gate PG may be formed to have a width narrower than a width of the main gate MG. Thus, a spacing distance S' between the field pass gate PG and the active region 16a may be increased as compared to the case of the example embodiment of FIG. 2. In a manner similar thereto, a width Wb of a second gate capping pattern 39' on the field pass gate PG may be formed to be narrower than a width Wa of a first gate capping pattern 39 on the main gate MG. In the example embodiment, an interval between the second source/drain region 19b and the field pass gate PG is relatively wide as compared to the example embodiment of FIG. 2, an electric field between the source/drain region 19b and the field pass gate PG may be further reduced as compared to the example embodiment of FIG. 2, and gate induced drain leakage (GIDL) by the field pass gate PG may be further reduced.

In the example embodiment, an upper surface height of the field pass gate PG may be reduced and a width of the field pass gate PG may be reduced, thereby reducing GIDL by the field pass gate PG.

According to another embodiment, with reference to FIGS. 1 and 6, a semiconductor device according to an example embodiment will be described. A structure different from that of the semiconductor device illustrated in FIG. 2 will be principally described below, and overlapping descriptions will be omitted.

Figure 6:
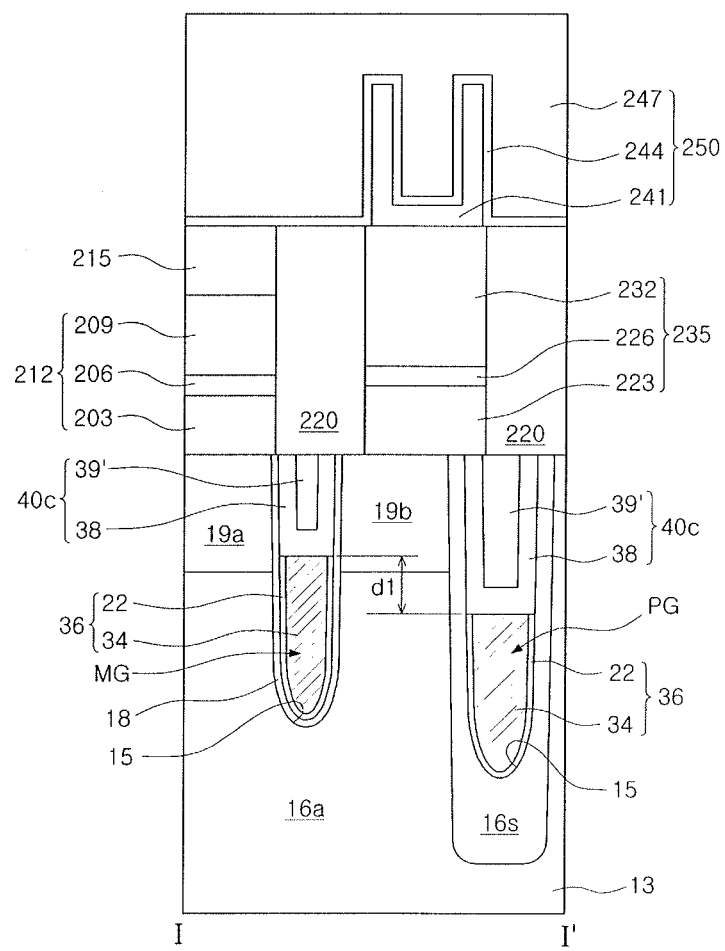

With reference to FIGS. 1 and 6, the upper surface of the field pass gate PG may be disposed to be lower than the upper surface of the main gate MG by the first distance d1. A gate capping pattern 40c may be disposed on the main gate MG and the field pass gate PG. The gate capping pattern 40c may include a lower gate capping layer 38 and an upper gate capping layer 39'. The lower gate capping layer 38 may include an insulating material having a dielectric constant lower than that of silicon nitride. For example, the lower gate capping layer 38 may include silicon oxide or a low-k material having a dielectric constant lower than that of silicon oxide. The upper gate capping layer 39' may include, for example, silicon nitride.

In the example embodiment, the gate capping pattern 40c including the lower gate capping layer 38 may have a relatively low dielectric constant as compared to that of silicon nitride. Thus, parasitic capacitance by the field pass gate PG may also be reduced along with an electric field reduction effect.

The example embodiments described above with reference to FIGS. 1 to 6 may be combined with each other to reduce GIDL and parasitic capacitance due to the field pass gate PG. For example, the example embodiments of FIGS. 2 and 3 may be combined with each other, and the example embodiments of FIGS. 2 and 4 may be combined with each other. The example embodiments of FIGS. 3 and 4 may be combined with each other, and the example embodiments of FIGS. 3 and 5 may be combined with each other. The example embodiments of FIGS. 4 and 6 may be combined with each other, and the example embodiments of FIGS. 5 and 6 may be combined with each other. The example embodiments of FIGS. 2 to 4 may be combined with each other, and the example embodiments of FIGS. 3 to 5 may be combined with each other. The example embodiments of FIGS. 2 to 4 may be combined with each other.

FIGS. 7 to 15 are cross-sectional views illustrating stages in a method of manufacturing the semiconductor device illustrated in FIG. 2.

Figure 7:
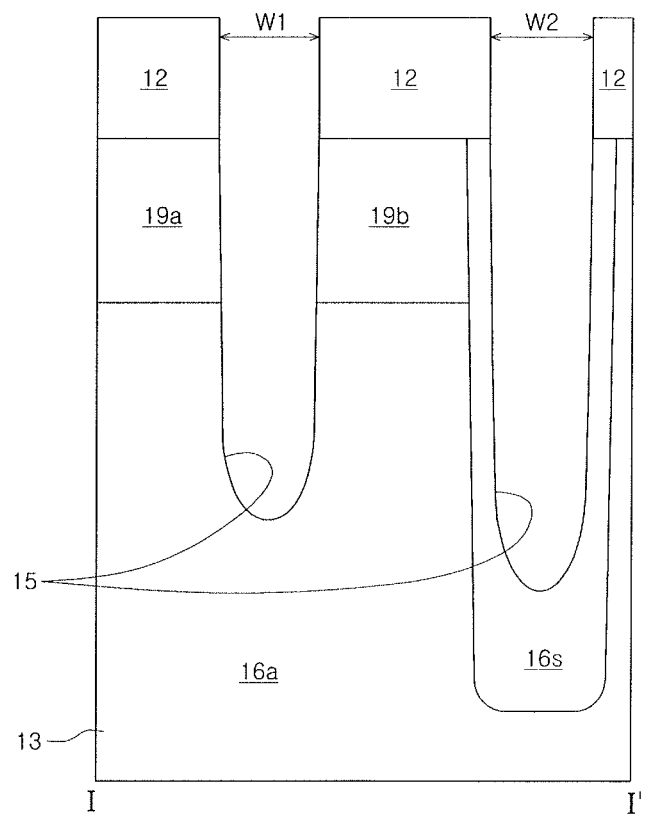
FIGS. 7 to 15 illustrate cross-sectional views of stages in a method of manufacturing a semiconductor device according to an example embodiment.

With reference to FIGS. 1 and 7, the semiconductor substrate 13 may be provided. The device isolation film 16s defining the active region 16a may be formed in the semiconductor substrate 13. The device isolation film 16s may be formed using a shallow trench isolation process. For example, forming the device isolation film 16s may include forming a field trench in the semiconductor substrate 13 and forming an insulating material therein to fill the field trench.

The first source/drain region 19a and the second source/drain region 19b may be formed in the active region 16a using ion implantation process. For example, the active region 16a may be a p-type conductivity active region, and the first and second source/drain regions 19a and 19b may be n-type conductivity regions.

A gate mask 12 may be formed on the semiconductor substrate 13 including the active region 16a and the device isolation film 16s. The gate mask 12 may be formed to include a material having an etch selectivity with respect to a material forming the active region 16a and a material forming the device isolation film 16s. The gate mask 12 may have a first width W1 in the active region 16a, and may have a second width W2 in the device isolation film 16s. The first width W1 and the second width W2 may be substantially identical to each other.

The gate trench 15 may be formed by etching the active region 16a and the device isolation film 16s by using the gate mask 12 as an etching mask. The gate trench 15 may have a linear form extended into the device isolation film 16s while passing through the active region 16a. In the case of the gate trench 15, a first portion thereof formed in the active region 16a may be shallower than a second portion thereof formed in the device isolation film 16s. For example, when the gate trench 15 is etched, the device isolation film 16s may be etched more deeply than the active area 16a, due to different etching rates, e.g., due to the different materials of the device isolation film 16s and the active area 16a. The gate trench 15 may be disposed between the first source/drain region 19a and the second source/drain region 19b to separate the first source/drain region 19a from the second source/drain region 19b.

Figure 8:
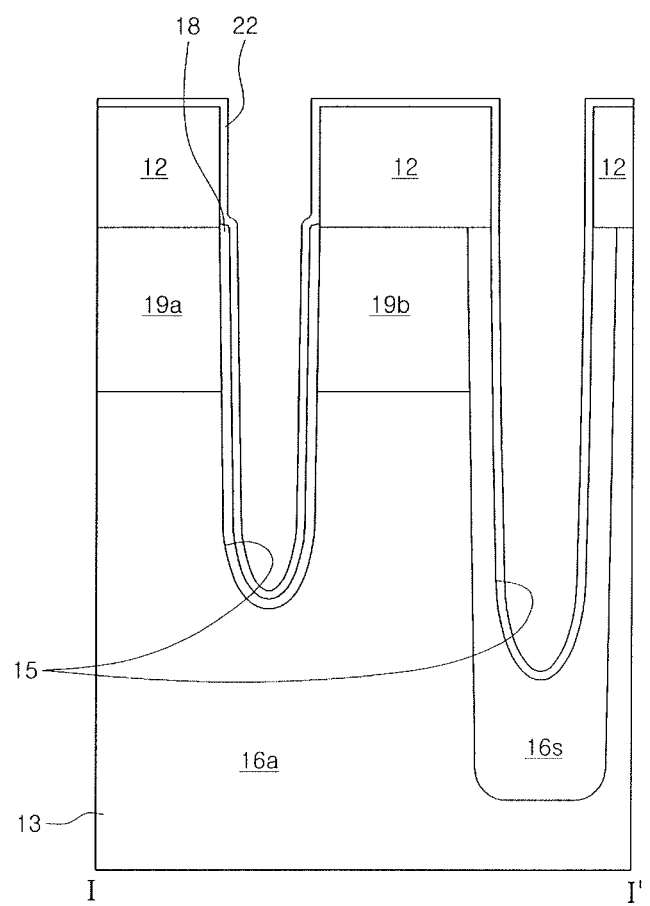

Referring to FIGS. 1 and 8, the gate dielectric 18 may be formed on the semiconductor substrate 13 having the gate trench 15. The gate dielectric 18 may be formed on a surface of the active region 16a exposed to the gate trench 15.

In the example embodiment, the formation of the gate dielectric 18 may be performed by an oxidation process. In this case, oxide may be formed on the active region 16a exposed by the gate trench 15. Examples of the oxidation process may include a thermal oxidation process, a radical oxidation process, a plasma oxidation process, and the like.

In an example, the formation of the gate dielectric 18 may be performed using a deposition process. In this case, the gate dielectric 18 may be formed on a surface of the isolation film 16s and a surface of the gate mask 12 as well as on a surface of the active region 16a exposed by the gate trench 15. An example of the deposition process may include, e.g., a chemical vapor deposition (CVD) process, an atomic layer deposition (ALD) process, or the like.

The gate dielectric 18 may be formed of, e.g., silicon oxide, or silicon oxide containing nitrogen. In one example, forming the gate dielectric 18 using silicon oxide containing nitrogen may include forming silicon oxide on the active region 16a exposed by the gate trench 15, via a thermal oxidation process, and doping nitrogen within the silicon oxide by performing a nitriding process with respect to the silicon oxide.

The barrier layer 22 may be conformally formed on the semiconductor substrate 13 including the gate electrode 18. The barrier layer 22 may be formed to have a uniform thickness to uniformly cover the gate dielectric 18. The barrier layer 22 may be formed of, e.g., metal nitride, for example, TiN or WN.

In an example, a source material layer including a specific element, e.g., lanthanum, may be formed on the barrier layer 22, and a heat treatment process may be performed thereon. The source material layer may be a metal oxide including a specific element. The specific element may be an element able to change a work function of the barrier layer 22. The specific element may be diffused into the barrier layer 22 by the heat treatment process. After the heat treatment process, the source material layer may be removed.

Figure 9:
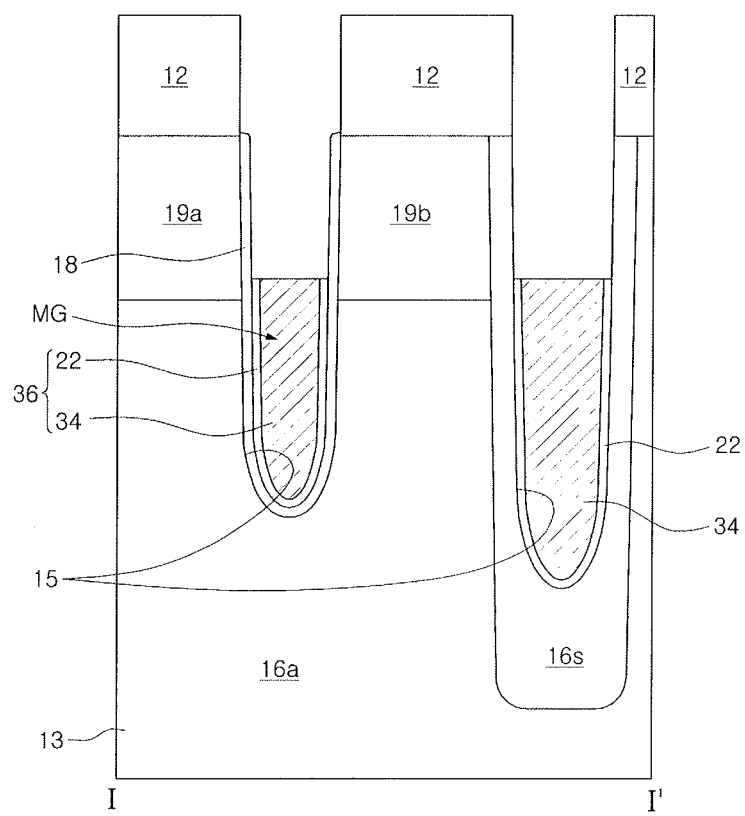

Referring to FIGS. 1 and 9, the conductive layer 34 may be formed on the barrier layer 22. The conductive layer 34 may fill the gate trenches 15. The conductive layer 34 may be formed of a metal having a specific resistance lower than that of the barrier layer 22. For example, the conductive layer 34 may include tungsten.

Then, the gate electrode 36 may be formed by partially etching the conductive layer 34 and the barrier layer 22 using an etchback process. The gate electrode 36 may partially fill the gate trench 15. An upper surface of the gate electrode 36 may be lower than an upper surface of the active region 16a. An upper portion of the gate electrode 36 may partially overlap the source/drain regions 19a and 19b. In this stage, the main gate MG embedded in the active region 16a may be formed in the active region 16a.

Figure 10:
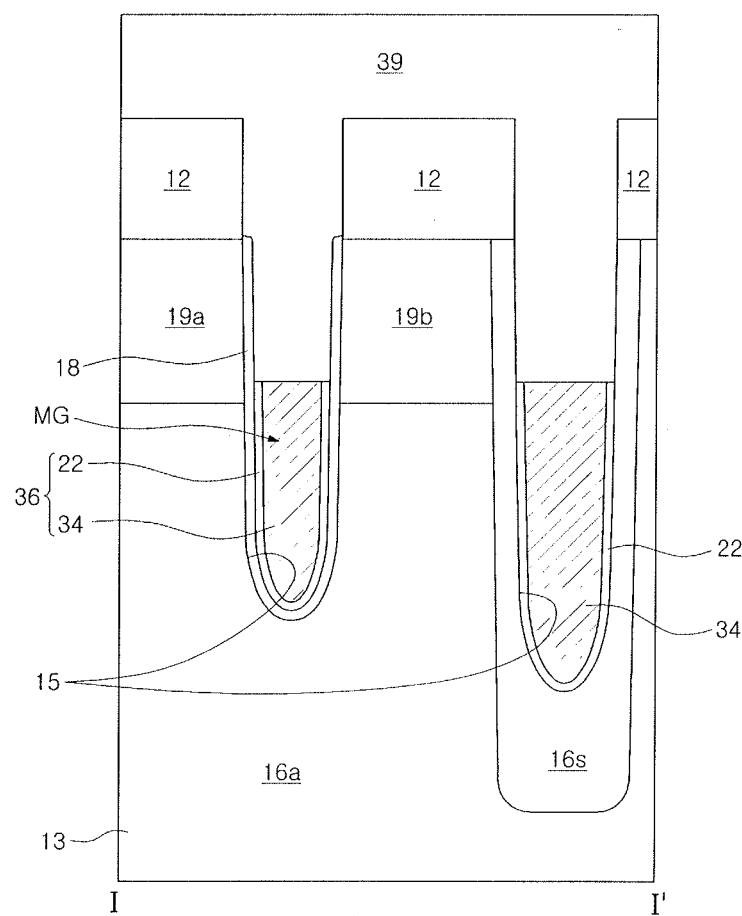

Referring to FIGS. 1 and 10, the first gate capping layer 39 having insulating properties, filling a remaining portion of the gate trench 15, may be formed on the gate electrode 36. The first gate capping layer 39 may be formed of silicon nitride.

Figure 11:
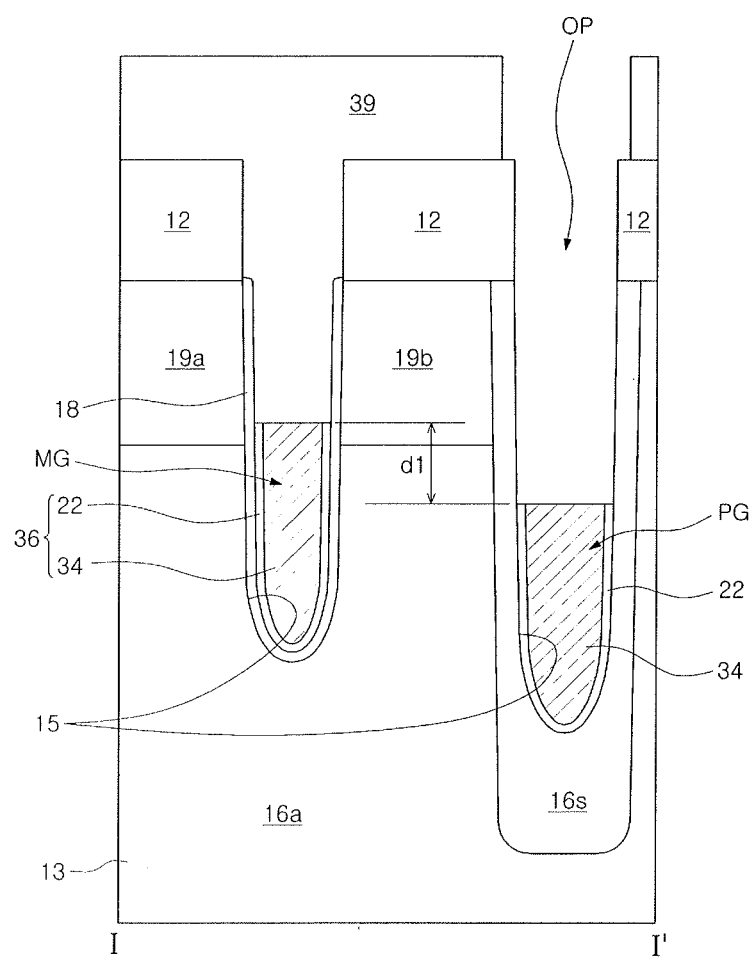
Figure 12:
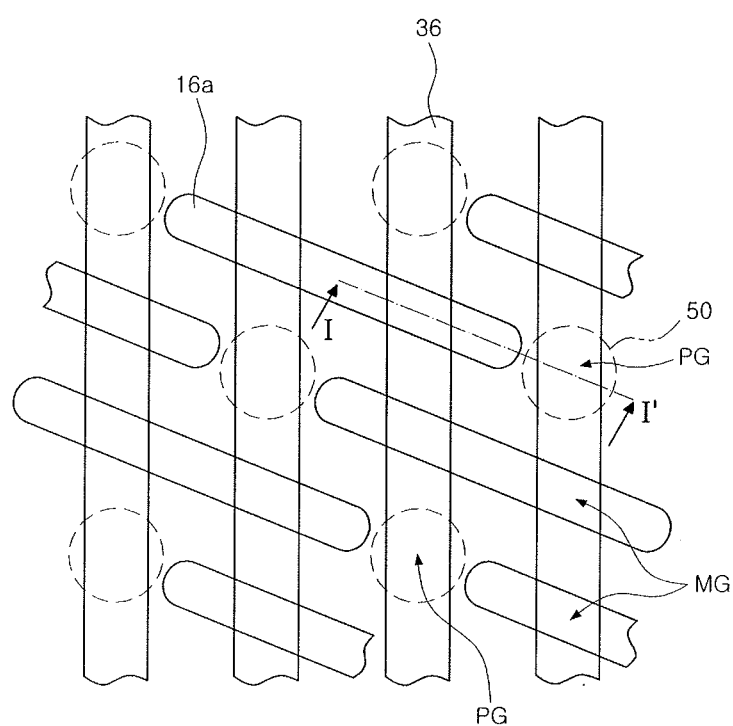
Figure 13:
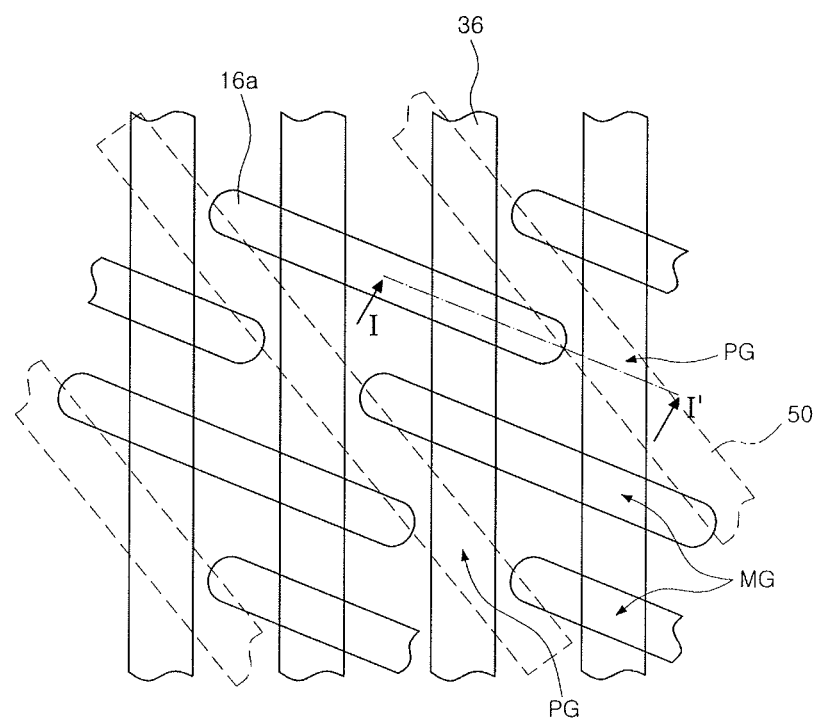

Referring to FIGS. 1, 11 and 12, the gate electrode 36 in the device isolation film 16s may be additionally removed by patterning the first gate capping layer 39. That is, a portion of the conductive layer 34 may be further removed from the gate electrode 36 in the device isolation film 16s to have the top of the gate electrode 36 in the active region 16a higher than the top of the gate electrode 36 in the device isolation film 16s.

In detail, the first gate capping layer 39 may be patterned to define openings only in a region overlapping the gate electrode 36 in the device isolation film 16s, such that portions of the gate electrode 36 in the device isolation film 16s may be removed, while the gate electrode 36 in the active region 16a may be covered by the first gate capping layer 39. Patterning the first gate capping layer 39 may include forming a photoresist pattern 50 on the first gate capping layer 39 and forming an opening OP by selectively etching the first gate capping layer 39 by using the photoresist pattern 50 as an etching mask. The photoresist pattern 50 may include openings, e.g., having a circular cross-sectional shape, allowing regions in which the field pass gates PG are formed to be exposed (see FIG. 12). In one example, the photoresist pattern 50 may include opening regions having an inclined linear form, allowing regions in which the field pass gates PG are formed to be exposed (see FIG. 13). After the first gate capping layer 39 in the device isolation film 16s is removed, a portion of the gate electrode 36 exposed through the opening OP may also be removed using an etch-back process. Thus, the field pass gate PG embedded in the device isolation film 16s may be formed.

The main gate MG embedded in the active region 16a may be located to be higher than an upper surface height of the field pass gate PG embedded in the device isolation film 16s. For example, the upper surface of the field pass gate PG may be disposed to be lower than the upper surface of the main gate MG by the first distance d1.

Figure 14:
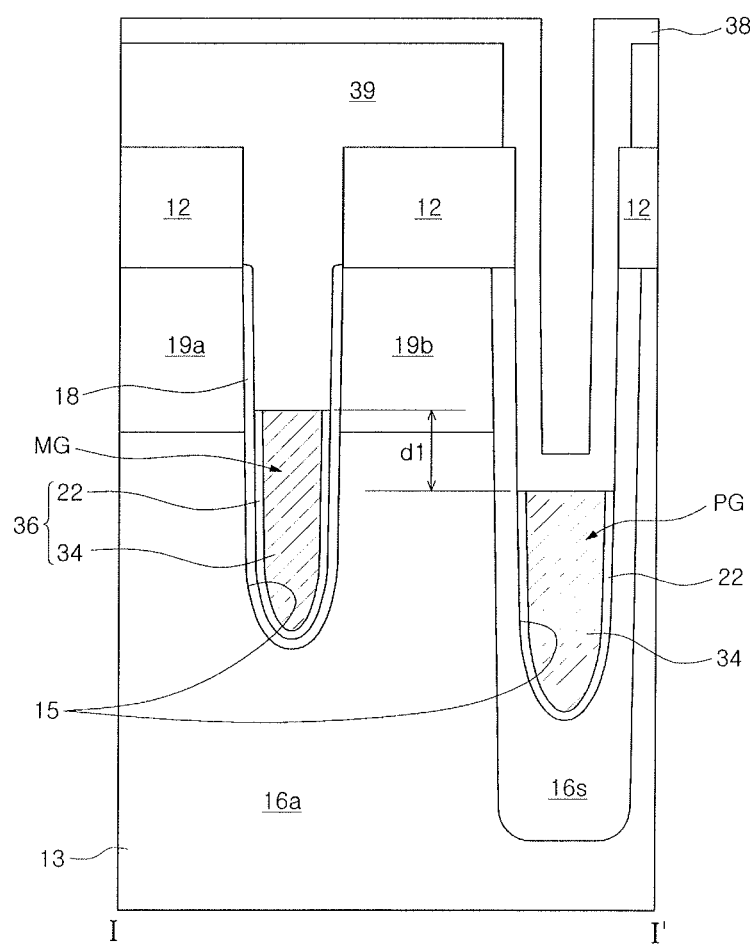

With reference to FIGS. 1 and 14, the second lower gate capping layer 38 may be formed on the field pass gate PG within the opening OP, to allow the field pass gate PG to be embedded therein. The second lower gate capping layer 38 may also be formed on the device isolation film 16s in the opening OP and on the first gate capping layer 39. The second lower gate capping layer 38 may include an insulating material having a dielectric constant lower than that of silicon nitride. For example, the second lower gate capping layer 38 may include a silicon oxide or a low-k material having a dielectric constant lower than that of silicon oxide.

Figure 15:
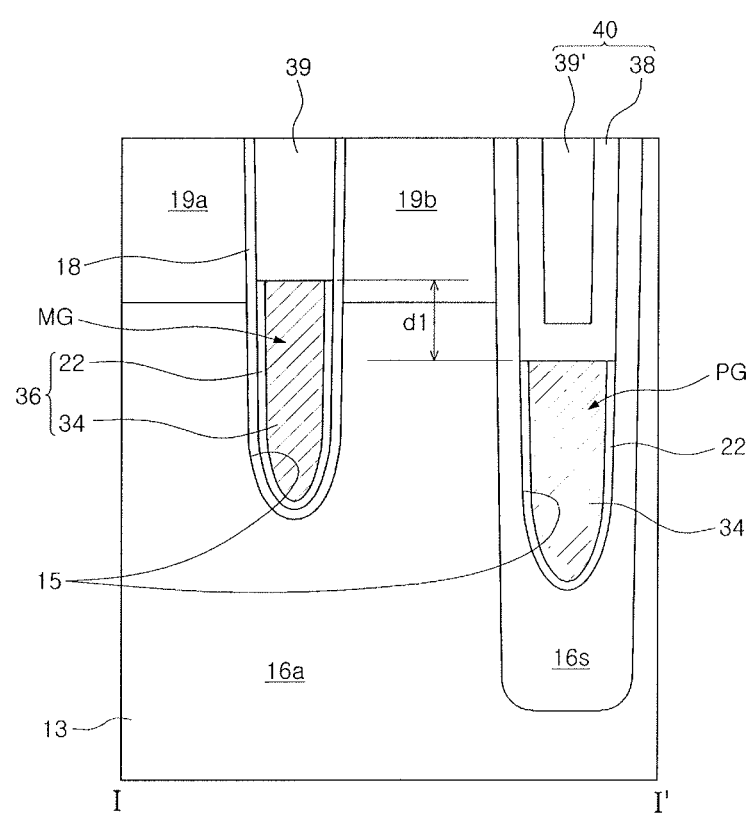

With reference to FIG. 15, the second upper gate capping layer 39' may be deposited on the second lower gate capping layer 38 to fill the opening OP, and a planarization process may be performed thereon until the upper surface of the active region 16a is exposed. Thus, the first gate capping layer 39 remaining on the main gate MG may form a first gate capping pattern, and the second lower gate capping layer 38 and the second upper gate capping layer 39' remaining on the field pass gate PG may form the second gate capping pattern 40. The second upper gate capping layer 39' may be formed of, e.g., the same material as a material of the first gate capping layer 39.

In addition, with reference back to FIGS. 1 to 3, the bit line structure 212 may be formed on the first source/drain region 19a, and the bit line capping pattern 215 may be formed on the bit line structure 212. The interlayer insulating layer 220 may be disposed on lateral surfaces of the bit line structure 212 and the bit line capping pattern 215. The contact structure 235 may be formed in such a manner that the contact structure is physically and/or electrically connected to a second source/drain region 19b while penetrating through the interlayer insulating layer 220. The information storage element 250 storing information therein may be disposed on the contact structure 235.

Figure 16:
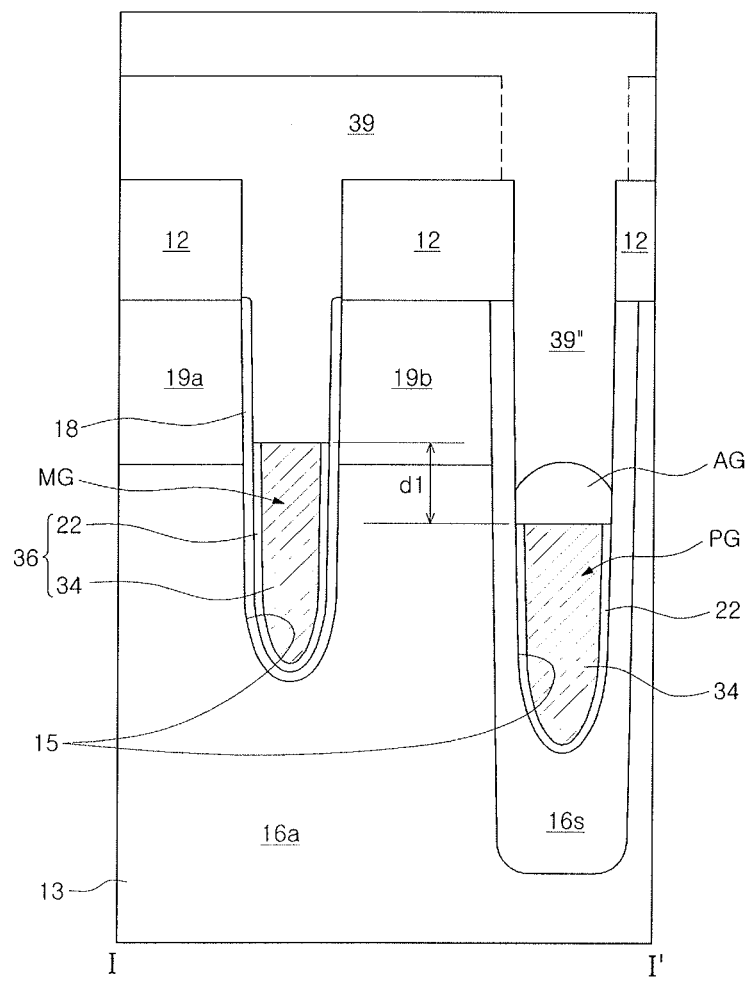
FIGS. 16 and 17 illustrate cross-sectional views of stages in a method of manufacturing a semiconductor device according to an example embodiment.
Figure 17:
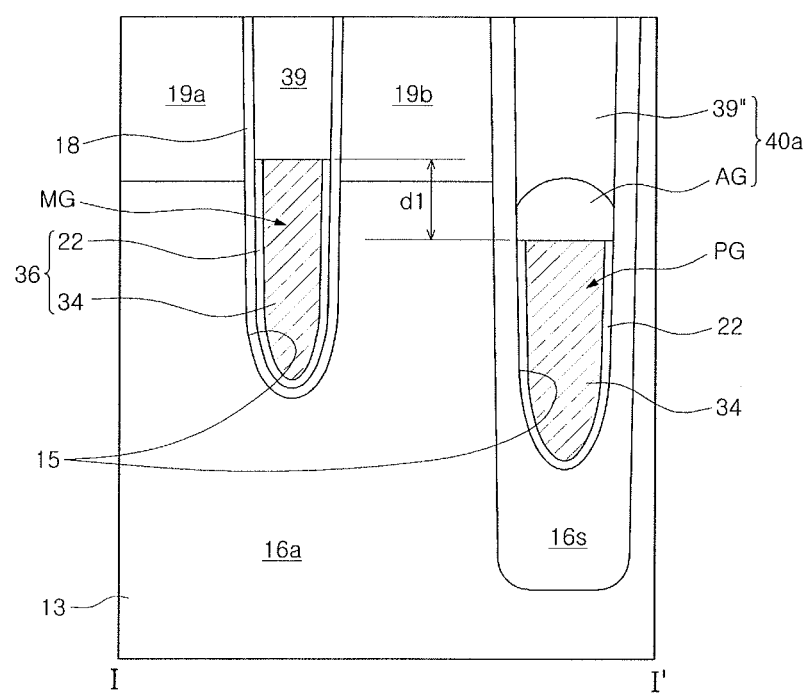

FIGS. 16 and 17 are drawings illustrating stages in a method of manufacturing a semiconductor device according to an example embodiment. After the processes described above with reference to FIGS. 7 to 13 are completed, processes described below with reference to FIGS. 16 and 17 may be performed.

With reference to FIG. 16, the second gate capping layer 39" may be formed in the opening OP, to allow the field pass gate PG to be embedded therein. In this case, the air gap AG may be formed below the second gate capping layer 39". The form and size of the air gap AG are not limited to those illustrated in the drawing. The second gate capping layer 39" may be formed using a deposition method in which step coverage characteristics are poor. The second gate capping layer 39" may cover the first gate capping layer 39. The second gate capping layer 39" may include an insulating material such as silicon nitride, silicon oxynitride, silicon oxide, or the like. The second gate capping layer 39" may be formed of, for example, the same material as a material of the first gate capping layer 39.

With reference to FIG. 17, a planarization process may be performed until the gate mask 12 is exposed, and the gate mask may be removed. Thus, the first gate capping layer 39 remaining on the main gate MG may form a first gate capping pattern, and the second gate capping layer 39" and the air gap AG remaining on the field pass gate PG may form a second gate capping pattern 40a.

Figure 18:
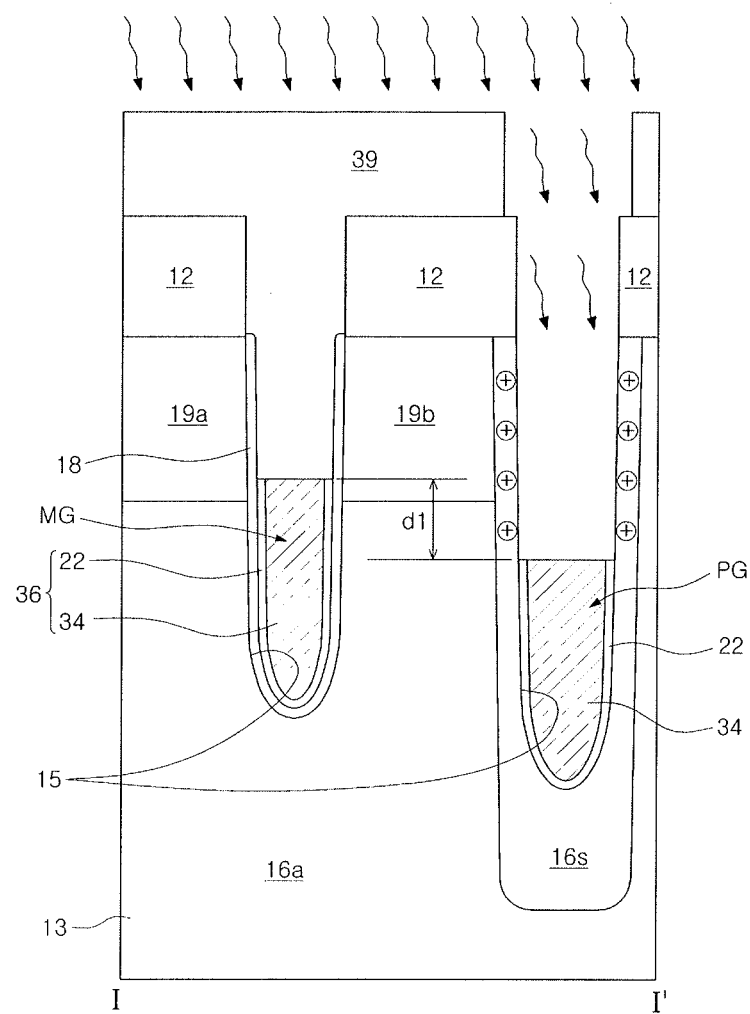
FIGS. 18 and 19 illustrate cross-sectional views of stages in a method of manufacturing a semiconductor device according to an example embodiment.
Figure 19:
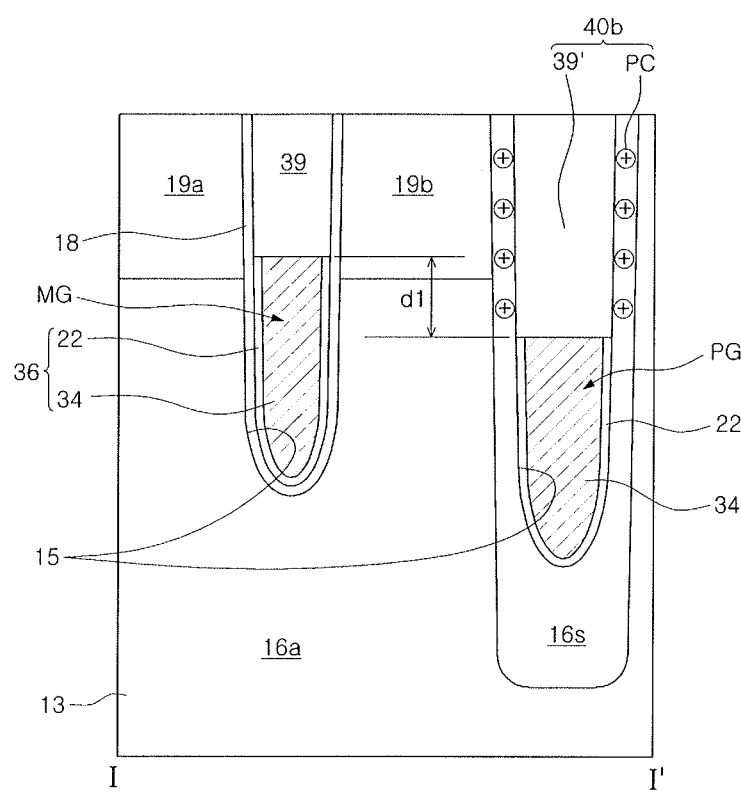

FIGS. 18 and 19 are views illustrating a method of manufacturing a semiconductor device according to the example embodiment of FIG. 4. After the processes described above with reference to FIGS. 7 to 13 are completed, processes described below with reference to FIGS. 18 and 19 may be performed.

Referring to FIG. 18, positive fixed charges PC trapped on a surface of the device isolation film 16s, forming a sidewall of the opening OP, may be formed. The positive fixed charges PC may be nitrogen cations formed using, for example, a plasma nitriding process or a heat treatment process using an NO gas.

With reference to FIG. 19, a second gate capping layer 39' may be deposited to fill the opening OP, and a planarization process may be performed thereon until the gate mask 12 is exposed. Then, the gate mask 12 may be removed. Thus, the first gate capping layer 39 remaining on the main gate MG may form a first gate capping pattern, and the second gate capping layer 39' and the fixed charges PC remaining on the field pass gate PG may form a second gate capping pattern 40b. The second gate capping layer 39' may be formed of, for example, the same material as that of the first gate capping layer 39.

Figure 20:
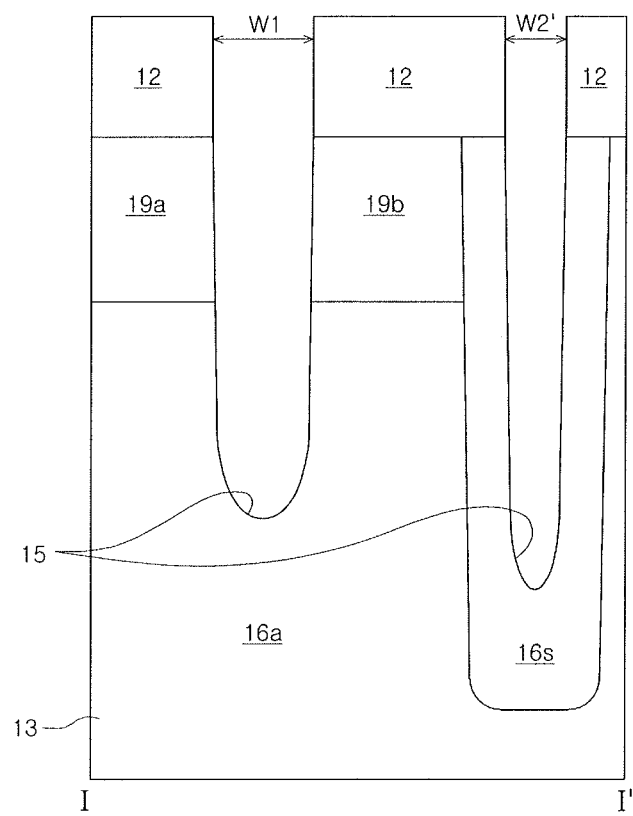
FIGS. 20 to 22 illustrate cross-sectional views of stages in a method of manufacturing a semiconductor device according to an example embodiment.
Figure 21:
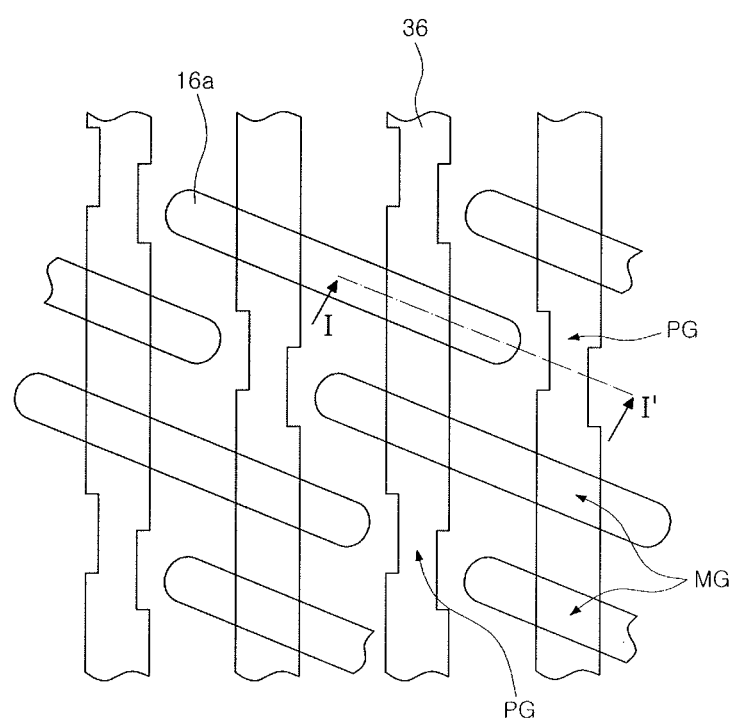
Figure 22:
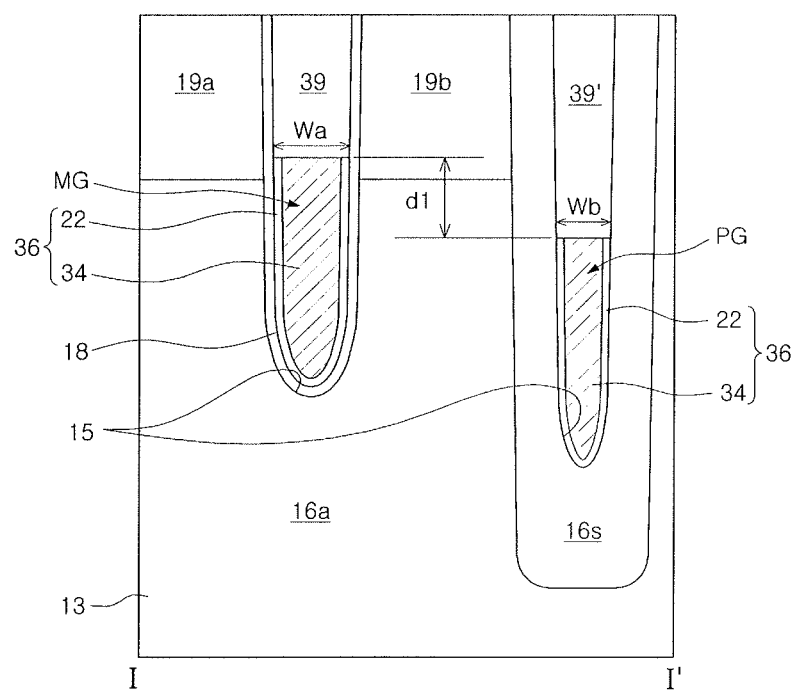

FIGS. 20 to 22 are views illustrating a method of manufacturing the semiconductor device according to the example embodiment illustrated in FIG. 5. FIG. 21 is a layout diagram of a semiconductor device according to an example embodiment.

With reference to FIG. 20, in a manner different from FIG. 7, the gate mask 12 may have the first width W1 in the active region 16a, and may have a second width W2' in the device isolation film 16s. The second width W2' may be narrower than the first width W1. Subsequently, the processes described above with reference to FIGS. 8 to 13 may be performed.

With reference to FIGS. 21 and 22, a second gate capping layer 39' may be deposited to fill the opening OP, and a planarization process may be performed thereon until the gate mask 12 is exposed. Then, the gate mask 12 may be removed. Thus, the first gate capping layer 39 remaining on the main gate MG may form a first gate capping pattern, and the second gate capping layer 39' remaining on the field pass gate PG may form a second gate capping pattern. In respective gate electrodes 36, extended in linear form according to the example embodiment, a width of a portion thereof, in which the field pass gate PG is disposed, may be narrower than a width of other regions thereof. A width Wb of the second gate capping pattern may be narrower than a width Wa of the first gate capping pattern. For example, an upper width of the field pass gate PG may be narrower than an upper width of the main gate MG. The field pass gate PG may be spaced apart from a sidewall of the active region 16a to have a distance therefrom greater than the cases in other example embodiments. The second gate capping layer 39' may be formed of, for example, the same material as that of the first gate capping layer 39.

Figure 23:
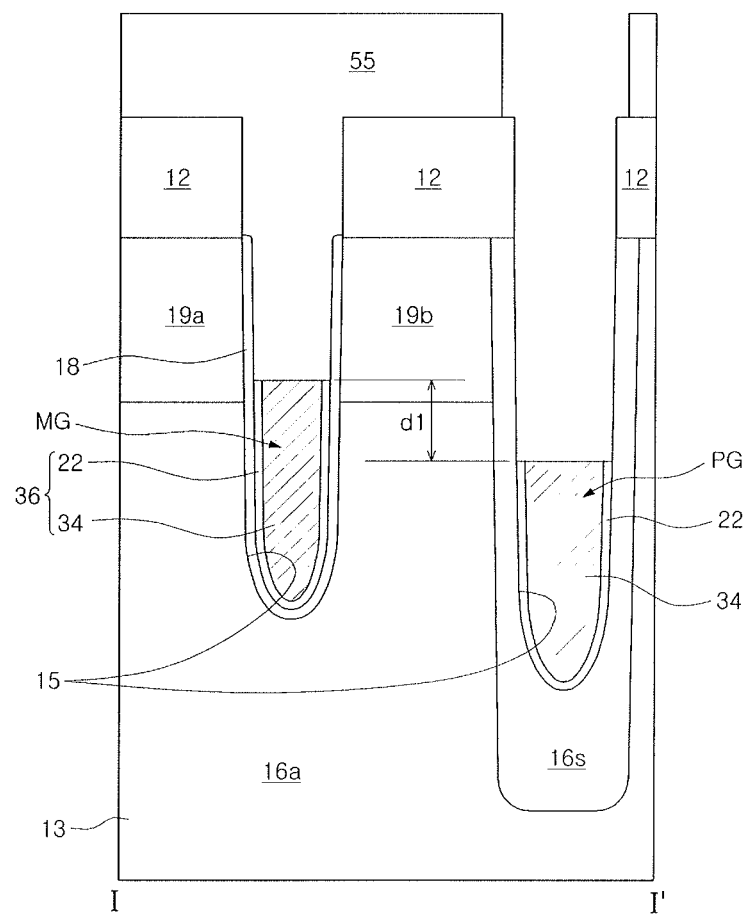
FIGS. 23 to 24 illustrate cross-sectional views of stages in a method of manufacturing a semiconductor device according to an example embodiment.
Figure 24:
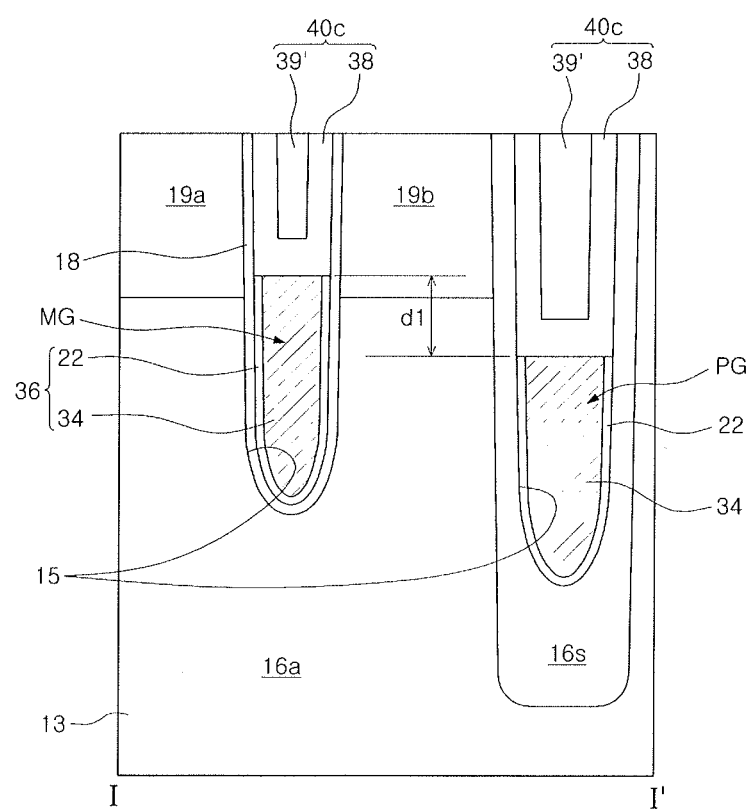

FIGS. 23 and 24 are views illustrating a method of manufacturing the semiconductor device according to the example embodiment of FIG. 5. After the processes described above with reference to FIGS. 7 to 9 are completed, processes of FIG. 23 may be performed.

Referring to FIG. 23, a photoresist pattern 55 may be formed on the gate mask 12, and the gate electrode 36 in the device isolation film 16s may be additionally removed. The photoresist pattern 55 may include openings having a circular cross-sectional shape, allowing regions in which the field pass gates PG are formed to be exposed (see FIG. 12). In an example, the photoresist pattern 55 may include opening regions having an inclined linear form, allowing regions in which the field pass gates PG are formed to be exposed (see FIG. 13). The gate electrode 36 in the device isolation film 16s, exposed by the photoresist pattern 55, may be additionally and partially etched using an etch-back process. Thus, the field pass gate PG embedded in the device isolation film 16s may be formed. The main gate MG embedded in the active region 16a may be located to be higher than an upper surface height of the field pass gate PG embedded in the device isolation film 16s. For example, an upper surface of the field pass gate PG may be disposed to be lower than an upper surface of the main gate MG by a first distance d1. The photoresist pattern 55 may be removed after the etch-back process is completed.

Gate capping patterns 40c may be disposed on the main gate MG and the field pass gate PG. The gate capping patterns 40c may respectively include a lower gate capping layer 38 and an upper gate capping layer 39'.

Figure 25:
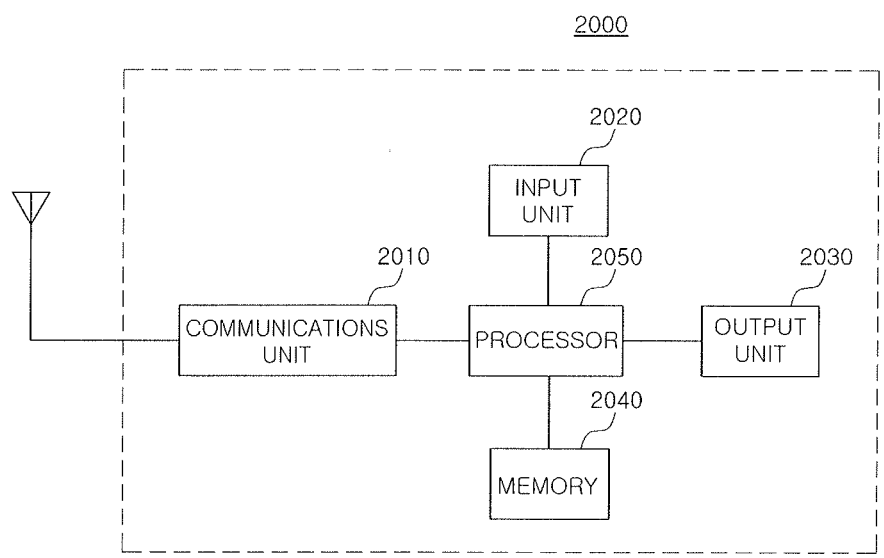
FIG. 25 illustrates a block diagram of an electronic device including a semiconductor device according to an example embodiment.

FIG. 25 is a block diagram of an electronic device including a semiconductor device according to an example embodiment.

With reference to FIG. 25, an electronic device 2000 according to an example embodiment may include a communications unit 2010, an input unit 2020, an output unit 2030, a memory 2040 and a processor 2050.

The communications unit 2010 may include a wired/wireless communications module, and may include a wireless Internet module, a near-field communications module, a global positioning system (GPS) module, a mobile communications module, or the like. The wired/wireless communications module included in the communications unit 2010 may be connected to an external communications network by various communications protocols to transmit and receive data.

The input unit 2020 may include a mechanical switch, a touchscreen, a voice recognition module, or the like, as a module allowing a user to control an operation of the electronic device 2000. In addition, the input unit 2020 may also include a mouse operated using a track ball or laser pointer scheme, or the like, or may include a finger mouse device. Further, the input unit 1020 may further include various sensor modules through which data is input by a user.

The output unit 2030 may output information processed by the electronic device 2000, in the form of voice or image, and the memory 2040 may store a program for processing and control of the processor 2050, data, or the like. The processor 2050 may transfer a command to the memory 2040 according to a necessary operation to thus store data or retrieve the data therefrom. The processor 2050 and the memory 2040 may include a semiconductor device manufactured using a method of manufacturing a semiconductor device according to an example embodiment described above.

The memory 2040 may communicate with the processor 2050 through, an interface embedded in the electronic device 2000 or through a separate interface. For example, when the memory 2040 communicates with the processor 2050 through a separate interface, the processor 2050 may store data in, or retrieve data from, the memory 2040 through various interface standards such as SD, SDHC, SDXC, MICRO SD, USB, or the like.

The processor 2050 may control operations of respective parts included in the electronic device 2000. The processor 2050 may perform controlling and processing of data relevant to voice communications, videotelephony, data communications, or the like, or relevant to multimedia reproduction and management. In addition, the processor 2050 may process an input by a user through the input unit 2020 and may output the processed results through the output unit 2030. Further, the processor 2050 may store data necessary for controlling operations of the electronic device 2000 in the memory 2040 or may retrieve data from the memory 2040.

As set forth above, according to an example embodiment, a semiconductor device in which leakage current is reduced by reducing an upper surface height of a field pass gate may be provided. That is, according to example embodiments, a gate metal material of a field pass gate may have an increased etch back depth, so a distance between the metal gate (of the field pass gate) and a GBC node (drain) of the main gate is increased, thereby reducing gate induced drain leakage (GIDL).

Further, according to an example embodiment, a semiconductor device in which parasitic capacitance by a field pass gate has been reduced may be provided. That is, a capping layer of the field pass gate has a structure different from that of a capping layer of the main gate, i.e., the capping layer of the field pass gate has an overall lower dielectric constant than the capping layer of the main gate, thereby reducing parasitic capacitance by the field pass gate along with an electric field reduction effect.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   an active region on a substrate;
   a device isolation film on the substrate to define the active region;
   a gate trench through the device isolation film and through the active region, the gate trench including a first portion in the active region and a second portion in the device isolation film;
   a gate electrode including a first gate embedded in the first portion of the gate trench and a second gate embedded in the second portion of the gate trench, an upper surface of the first gate being higher than an upper surface of the second gate;
   a first gate capping pattern on the first gate and filling the first portion of the gate trench; and
   a second gate capping pattern on the second gate and filling the second portion of the gate trench, the first gate capping pattern and the second gate capping pattern have different structures.

2. The semiconductor device as claimed in claim 1, wherein:

the first gate capping pattern includes a first insulating layer having a first dielectric constant, and the second gate capping pattern includes a second insulating layer including a same material as the first insulating layer, and a third insulating layer having a dielectric constant lower than a dielectric constant of the second insulating layer, the third insulating layer surrounding a lateral surface and a lower surface of the second insulating layer.

3. The semiconductor device as claimed in claim 2, wherein the first insulating layer and the second insulating layer include silicon nitride, and the third insulating layer includes a material having a dielectric constant lower than a dielectric constant of silicon nitride.

4. The semiconductor device as claimed in claim 1, wherein the first gate capping pattern includes a first insulating layer having a first dielectric constant, and the second gate capping pattern includes a second insulating layer including a same material as the first insulating layer and an air gap.

5. The semiconductor device as claimed in claim 1, wherein the first gate capping pattern includes a first insulating layer having a first dielectric constant, and the second gate capping pattern includes a second insulating layer including a same material as the first insulating layer and a positive fixed charge trapped on a surface of the device isolation film adjacent to the second insulating layer.

6. The semiconductor device as claimed in claim 1, wherein a width of the second gate capping pattern is less than a width of the first gate capping pattern.

7. The semiconductor device as claimed in claim 6, wherein a width of the second gate is less than a width of the first gate.

8. The semiconductor device as claimed in claim 1, further comprising a source/drain region on the active region, the second gate not overlapping the source/drain region.

9. The semiconductor device as claimed in claim 8, further comprising an information storage element electrically connected to the source/drain region.

10. The semiconductor device as claimed in claim 9, wherein the information storage element is a capacitor.

11. A semiconductor device, comprising:
a substrate including an active region and a device isolation film defining the active region;
a gate trench through the device isolation film and through the active region, the gate trench including a first portion in the active region and a second portion in the device isolation film;
a gate electrode including a first gate embedded in the first portion of the gate trench and a second gate embedded in the second portion of the gate trench; and
a gate capping pattern on the first gate and the second gate, an upper surface of the first gate being higher than an upper surface of the second gate, and the gate capping pattern having a structure in which different materials are stacked.

12. The semiconductor device as claimed in claim 11, wherein the gate capping pattern includes a first insulating layer having a first dielectric constant, and a second insulating layer having a dielectric constant lower than a dielectric constant of the first insulating layer and surrounding a lateral surface and a lower surface of the first insulating layer.

13. The semiconductor device as claimed in claim 12, wherein the first insulating layer includes silicon nitride, and the second insulating layer includes a material having a dielectric constant lower than a dielectric constant of silicon nitride.

14. The semiconductor device as claimed in claim 11, further comprising a source/drain region on the active region, the source/drain region not overlapping the second gate.

15. The semiconductor device as claimed in claim 14, further comprising an information storage element electrically connected to the source/drain region.

16. A semiconductor device, comprising:
an active region on a substrate;
a device isolation film on the substrate to define the active region;
a gate trench including a first portion through the active region and a second portion through the device isolation film;
a gate electrode including a first gate in the first portion of the gate trench and a second gate in the second portion of the gate trench, an upper surface of the first gate being higher than an upper surface of the second gate relatively to a bottom of the substrate;
a first gate capping pattern on the first gate; and
a second gate capping pattern on the second gate, the second gate capping pattern having a lower dielectric constant than the first gate capping pattern.

17. The semiconductor device as claimed in claim 16, wherein the second gate capping pattern has a structure in which different materials are stacked, an overall dielectric constant of the stacked different materials being lower than that of the first gate capping pattern.

18. The semiconductor device as claimed in claim 17, wherein one material of the stacked different materials of the second gate capping pattern is the same as a material of the first gate capping pattern.

19. The semiconductor device as claimed in claim 16, wherein the upper surface of the first gate being higher than the upper surface of the second gate along a direction normal to the bottom of the substrate, the first and second gates being further spaced apart from each other along a horizontal direction.

20. The semiconductor device as claimed in claim 19, wherein the first gate capping pattern includes silicon nitride, and the second gate capping pattern includes silicon nitride and an additional material having a dielectric constant lower than silicon nitride, the additional material surrounding lateral surfaces and bottom of the silicon nitride in the second gate capping pattern.

* * * * *